United States Patent [19]

Lerche

[11] 4,114,050
[45] Sep. 12, 1978

[54] INTEGRATING CIRCUIT

[75] Inventor: Heinz Lerche, Bremen, Germany

[73] Assignee: Varian Mat GmbH, Bremen, Germany

[21] Appl. No.: 755,881

[22] Filed: Dec. 30, 1976

[30] Foreign Application Priority Data

Jan. 5, 1976 [DE] Fed. Rep. of Germany ....... 2600194

[51] Int. Cl.² ............................................. H03K 17/00
[52] U.S. Cl. ................................ 307/229; 307/317 R; 328/127; 328/151
[58] Field of Search ........... 307/229, 230, 238, 317 R; 328/127, 128, 151

[56] References Cited

U.S. PATENT DOCUMENTS

| 3,517,879 | 6/1970 | Conway | 307/229 |
| 3,667,055 | 5/1972 | Uchida | 328/127 |
| 3,832,536 | 8/1974 | LeDily et al. | 328/127 |
| 3,869,624 | 3/1975 | Fletcher et al. | 328/151 |
| 3,902,053 | 8/1975 | Figaeroa | 328/127 |

Primary Examiner—Stanley D. Miller, Jr.
Assistant Examiner—B. P. Davis
Attorney, Agent, or Firm—Sughrue, Rothwell, Mion, Zinn and Macpeak

[57] ABSTRACT

An integrating circuit comprises an integrating amplifier having an inverting input for receiving a signal to be integrated, and a feedback capacitor connected between the output of the amplifier and its inverting input. The output of the integrating amplifier is connected one input of a second amplifier having another input connected to zero potential. The output of the second amplifier is connected to a diode switching arrangement which is actuated between a conductive state in which a d.c. connection is established between the output of the second amplifier and the inverting input of the integrating amplifier and the feedback capacitor is forcibly discharged and a non-conductive state in which the d.c. connection is interrupted and the output of the second amplifier is connected to zero potential so as to enable the integrating amplifier to integrate the signal received by its inverting input.

9 Claims, 7 Drawing Figures

INTEGRATING CIRCUIT

BACKGROUND OF THE INVENTION

The invention relates to a discharge circuit for the integrating capacitor of an integrating amplifier with capacitative feedback.

When currents or voltages are integrated with respect to time in accordance with the well known principle of the amplifier with capacitative feedback, the integral is available at the amplifier output in the form of a voltage. When a measuring signal is applied, the voltage therefore increases with the measuring time so that given a correspondingly long measuring time and a low capacitance of the integrating capacitor or a small time constant of the integrating channel, it is possible in theory to achieve voltage values of any desired magnitude. In practice, however, the ultimate output voltage swing of the amplifiers seldom exceeds 100 V and therefore imposes limits which must not be exceeded or must be taken into account when dimensioning the integrating capacitor or the time constant of the integrating element. A large measuring signal or a long measuring time results in a large capacitance value of the integrating capacitor or in a large time constant of the integrating element.

Precise measurements with a high resolution in voltage terms of the integral and a wide dynamic measuring range call for a low capacitance value of the integrating capacitor or for a small time constant of the integrating element so that the integrating capacitor must be discharged during the measuring procedure in the case of large measuring signals or prolonged measuring procedures after reaching the maximum output voltage of the appropriate amplifier type and the number of discharges must be counted. No integration of the measuring signal takes place during the discharge time, so that the actual integration time is shortened and a measuring error is produced. The measuring error becomes smaller in accordance with the briefness of the discharge time which can be obtained in relation to the integrating time. Given integrating times in the seconds and milliseconds range, it may be necessary to provide discharge times of a few milliseconds or microseconds.

To detect the change of a signal with respect to time, it is advantageous for many measuring problems, but more particularly when measuring small signals, to integrate the measured signal in interval steps. If the signal characteristic calls for a high resolution in terms of time, it means that only very short integration intervals are possible for a high measuring signal rate. The measuring rate becomes very high so that the individual amplitude values can be stored and evaluated only by digital data logging systems. Owing to the short integration times, the accuracy of this measuring method is defined substantially by the accuracy of the integration interval, i.e. by the timing precision with which the integration beginning and end is controlled. Control accuracies in the microsecond or nanosecond range may be necessary for integrationtimes in the millisecond and microsecond range.

In addition to a suitable choice of integrating amplifier and integrating capacitor, it is the embodiment of the discharge procedure and discharge control of the integration capacitor which decide the feasibility of these integrating processes and the accuracy and reproducibility of the measured results.

In conventional processes the integrating capacitor is discharged by a parallel-connected, electrically controllable switch. This must take account of different circumstances.

During the discharge procedure the switch must have a low resistance so that the integrating capacitor is rapidly discharged and the current to be integrated, and then flows through the switch, does not produce a voltage drop across the switch and therefore also not across the integration capacitor which would cause the latter to receive an initial charge than would falsify the result of the next integration procedure.

During the integrating procedure the switch must also have a high resistance so that the integrating capacitor is not provided with a shunt which would result in branching of the current or discharging of the integrating capacitor and thus produce a measuring error. The fault current of the switch on the other hand must be small in terms of the lowest current to be integrated and which in practice can amount to 1 pA and less.

Furthermore, the switch must be arranged so that it can be controlled without delay and chatter so that specified integration times or integration intervals can be exactly maintained.

Furthermore the control pulse of the switch must not induce or influence a charge in the integrating capacitor. No residual voltage must remain on the switch despite dynamic low-resistance characteristics. Finally, the switch should be capable of providing bipolar performance.

The most important technical data of known switches are listed in the Table below:

| Switch | $R_{in}$ or residual voltage | $R_{out}$ or fault current | Interval delay in | Interval delay out | Integration time error | Control pulse transmission | bi-point |
|---|---|---|---|---|---|---|---|
| Reed relay | 0.1 Ω | 10 TΩ | 0.5ms | 0.3ms | 0.2 ms + 0.2 ms chatter time | screen- | yes |
| Transistor | 10 mV | 10 nA | 15 ns | 5 μs | 5 μs | available | no |
| Transistor with diode | 50 mV | 30 nA | 15 ns | 15 ns | 5ns | available | no |
| FET Switch | 50 Ω | 5 nA | 1 μs | 0.5 μs | 0.5 μs | available | no |

The advantages and disadvantages of the individual switches are approximately uniformly distributed over all switches and depending on the measuring conditions have different significance for the accuracy of the measured result. However, compromise solutions must be adopted if stringent requirements are made on the versatility and accuracy of the integrator because no switch is capable of fulfilling all requirements.

The object of the present invention is to avoid the inadequacies of known discharge circuits and to provide a discharge circuit of the kind mentioned initially in which the disadvantages due to the components are avoided substantially by circuit means to obtain optimum data for the switching device.

SUMMARY OF THE INVENTION

According to the invention, the problem is solved in that the output of the integrating amplifier is connected to the non-inverting input of a second amplifier and the inverting input of the said second amplifier is connected to zero potential, the output of the second amplifier is connected to an electrically controllable switching device which connects the output of the second amplifier in a first position to the inverting measuring input of the integrating amplifier and in a second position to zero potential. In the circuit according to the invention the procedure adopted therefore is such that the output voltage of the integrating amplifier is supplied to a second amplifier, that the second amplifier performs a constant comparison between the said output voltage and zero potential, provides in-phase amplification of the deviations from zero potential and conducts said deviations to an electrically controllable switching device which, in a first position thereof, returns the deviations to the measuring input of the integrating amplifier so that the output voltage of the closed control loop is controlled to zero potential and the integrating capacitor is thus forcibly discharged and which, in a second position, separates the deviations from the measuring input of the integrating amplifier and conducts them to zero potential so as to permit unobstructed integration of a measuring input to the integrating capacitor of the integrating amplifier. The circuit according to the invention permits accurate, extremely rapid and precisely controllable discharge of integrators, advantageously with small capacitances down to approximately 10 pF for the integration of currents, more particularly low currents, down to approximately 1 pA during integrating times, more particularly short integrating times, down to approximately 10 μs with discharge times down to approximately 5 μs.

With circuit according to the invention and the method according to the invention it is possible to obtain technical data for the discharge procedure which in their entirety are for superior to data higherto attainable. The values relating to the quantities of the above-mentioned Table, which can be achieved by the circuit according to the invention, are quoted by comparison:

Further features, details and advantages of the invention are disclosed in the description hereinbelow of exemplified embodiments which are illustrated in the accompanying drawing in which:

Figure 1:
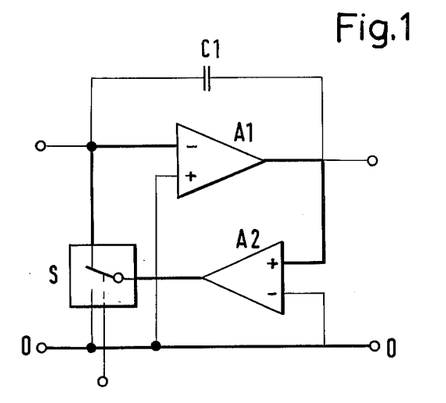
FIG. 1 is a basic circuit diagram of the discharge circuit according to the invention.

FIG. 1 shows the principle of the discharge circuit. The measuring signal is applied to the inverting input of the integrating amplifier A1 which is provided with capacitative feedback through the integrating capacitor C1. The output of the integrating amplifier A1 is connected to the non-inverting input of the amplifier A2, the inverting input of which is grounded. The non-inverting input of the integrating amplifier A1 is also grounded. The output of the amplifier A2 is connected to a switching device S which connects the output of the amplifier A2 in the illustrated switched position to the inverting input of the integrating amplifier A1 and in the other switched position to grounded.

If the switching device S is in the position illustrated, corresponding to the discharged state of the circuit, the current to be integrated will then flow via the switching device to the output of the amplifier A2, the conditions will then conform to the terms indicated below:

$$U_{aA1} = U_{aA2}(-V_{A1})$$

$$U_{aA2} = (U_{aA1} - U_{e(-)A2}) V_{A2}$$

$$U_{aA1} = U_{e(-)A2} \frac{V_{A1} \cdot V_{A2}}{V_{A1} \cdot V_{A2} + 1} \quad (1)$$

where:
$U_{aA1}$ is the output voltage of the integrating amplifier A1,
$U_{aA2}$ is the output voltage of the amplifier A2,
$U_{e(-)A2}$ is the input voltage on the inverting input of the amplifier A2,
$V_{A1}$ is the gain of the integrating amplifier A1, and
$V_{A2}$ is the gain of the amplifier A2.

Since the inverting input of the amplifier A2 is connected to ground, i.e. $U_{e(-)A2} = 0$ V, it follows from Equation (1) that:

$$U_{aA1} = 0 \, V.$$

Equation (1) also reveals that the quantity of the zero point of the integrator depends on the offset voltage of the amplifier A2 but not on the offset voltage and the

| Invention 10 mΩ | not applicable | 20 ns | 20 ns | 5 ns | not applicable | yes | offset voltage drift of the integrating amplifier A1 which, by contrast to the amplifier A2, must be characterised substantially by a small input current. This is an advantage compared with conventional discharge procedures because in this case the amplifiers need be selected only in accordance with one criterion.

If the switching device assumes the switched position corresponding to the integrating state of the circuit — the current to be integrated will then flow into the integrating capacitor C1 — the conditions will be described by:

$$U_C = \frac{1}{C} \int_0^t i\, dt \qquad (2)$$

where:
$U_C$ is the capacitor voltage, and
C is the capacitance of the integrating capacitor C1.
The condition $$U_C = U_{e(-)A1} + U_{aA1}$$

applies since the integrating capacitor C1 is connected between the inverting input and the output of the integrating amplifier A1, where $U_{e(-)A1}$ is the input voltage (measured signal) on the inverting input of the integrating amplifier A1.
If $$U_{e(-)A1} = \frac{U_{aA1}}{V_{A1}} \text{ we obtain}$$

$$U_{aA1} = U_C \frac{V_{A1}}{V_{A1} + 1}.$$

The amplification factor V of modern amplifiers is approximately $10^4$ to $10^6$ so that (V/V + 1) differs only slightly from 1. Accordingly, $U_{aA1} = U_C$ and with Equation (2) we obtain:

$$U_{aA1} = \frac{1}{C} \int_0^t i\, dt.$$

Figure 2:
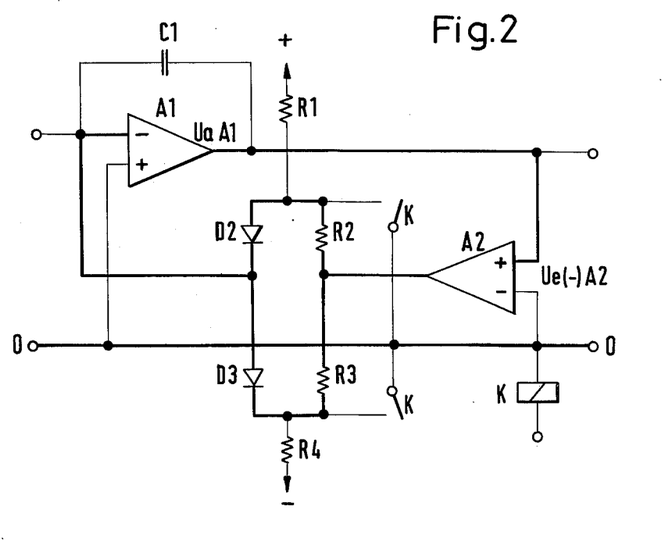
FIG. 2 is a basic circuit diagram of the discharge circuit but with greater details than those in FIG. 1.

A simple embodiment of the switching device S is shown in FIG. 2. In principle it comprises a series connection of two semiconductor diodes through which an auxiliary current flows on which is superimposed the signal that is to be switched. The auxiliary current flows through the resistors R1, R4 into the switching device in which the current branches to flow through the resistors R2, R3 and the diodes D2, D3. The diodes D2, D3 are thus driven conductively to establish a dc connection between the output of the amplifier A2 via the resistors R2, R3 and the diodes D2, D3, and the inverting input of the integrating amplifier A1 to close the control loop. The non-inverting input of the amplifier A2 is controlled to 0 V in accordance with its inverting input and the inverting input of the integrating amplifier A1 is controlled to 0 V in accordance with its non-inverting input. The junction of the diodes D2, D3 is therefore virtually grounded. The output voltage of the amplifier A2 is kept low because of the bridge arrangement of the diodes D2, D3 and of the resistors R2, R3. Voltage drops which occur over the transmission path between the output of the amplifier A2 and the inverting input of the integrating amplifier A1 are divided by the amplification factor $V_{A2}$ of the amplifier A2 and appear in divided form on the output of the integrating amplifier A1 and thus become negligibly small.

The discharged state must be terminated as soon as a signal is to be integrated. To this end the closed loop must be opened by interruption through the switching device S of the connection between the output of the amplifier A2 and the inverting input of the integrating amplifier A1. Interruption is obtained by virtue of the auxiliary current, part of which flows through the diodes D2, D3 to drive them into the conductive state, being diverted, for example by means of a contact pair K against zero potential so that the diodes D, D3 become dead and are driven to cut-off as a result of which the dc connection between the output of the amplifier A2 and the inverting input of the integrating amplifier A1 is interrupted. The control loop will therefore also be opened and the current to be integrated, previously flowing through diodes D2, D3 and the resistors R2, R3 to the output of the amplifier A2 will then flow to the integrating amplifier C1. The bridge resistors R2, R3 have an additional current-limiting effect and prevent the output of the amplifier A2 being short-circuited by the contacts K. By contrast to conventional discharge methods, no stringent requirements are made on the performance of the contacts K in FIG. 2 as regards high resistance in the open state and low resistance in the closed state so that these contacts can be replaced by transistors. Transistors in this case offer the advantage that they operate without chatter and respond practically without delay to a control signal.

Figure 3:
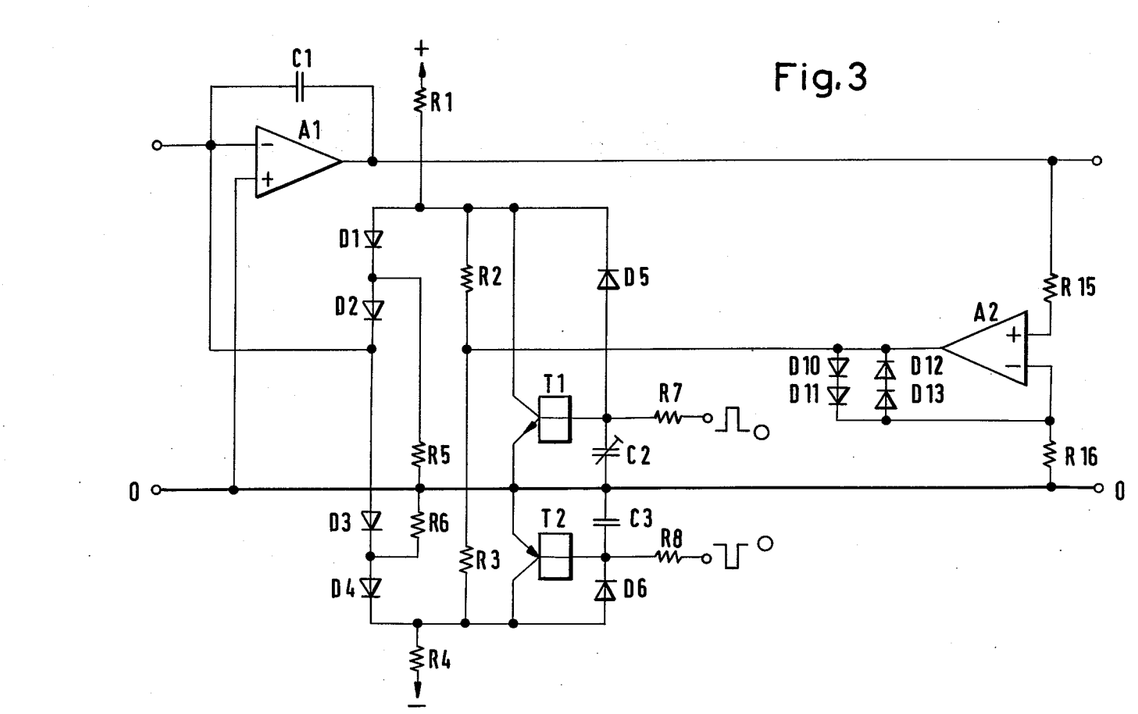
FIGS. 3 to 5 show different embodiments of the discharge circuit according to the invention.

The contacts K in FIG. 3 are replaced by the complementary transistors T1, T2. The diodes D5, D6 prevent the transistors T1, T2 being modulated to saturation voltage when they are in the conductive state which would otherwise result in cut-off delays of a few us. Pico ampere diodes must be used for the diodes D2, D3 for integrating currents in the pA rrange. The disadvantage of pico ampere diodes is in the relative long cut-off delay which differs from specimen to specimen. This means that when the discharged state is terminated by the transistors T1, T2 being driven, the integrating capacitor C1 already receives an initial charge through the diode which is the last to be driven to cut-off. This problem is solved in that a rapid-acting siwtching diode D1, D4 with a cut-off delay of only a few ns is connected in series with each of the pico ampere diodes D2, D3. This results in a diode system of extremely high resistance but also very rapid in action. The resistors R5, R6 have high values and define the potential between the diodes D1, D2 and D3, D4. The integrating capacitor C1 can also receive an undesired initial charge if driving the transistors T1, T2 into the conductive state does not occur precisely at the same time. This is the case if the transistors T1, T2 have different switching times or if the control voltages or control pulses for the transistors T1, T2 arrive at different times. If a control voltage is applied the resistors R7, R8, limit the base current of the transistors T1, T2 and in conjunction with the capacitors C2, C3 form delay elements operating in the ns range by means of whose variable time constant it is possible to equalise different switching times of the transistors T1, T2 and minor time differences between incoming control voltages and thus to trim the initial charge and therefore the initial voltage of the integrating capacitor C1 to zero V. Since the diodes D1, D2 and D3, D4 and balanced with respect to zero, it follows that the action of their charged internal capacitances cancel each other. The inverting input of the integrating amplifier A1 must belocally separated from all pulse-carrying conductors in order to avoid stray capacitance effects. The diodes D10, D11 and D12, D13 prevent the amplifier A2 being driven to saturation by the output voltage of the integrating amplifier A1 as interfering storage times would otherwise result. If necessary, the number of diodes can be increased. The resistor R15 is connected between the output of the integrating amplifier A1 and the non-inverting input of the amplifier A2 and the resistor R16 is connected between zero potential and the inverting input of the amplifier A2. The complementary transistors T1, T2 are driven by two precisely balanced voltages or pulses of different polarity.

Figure 4:
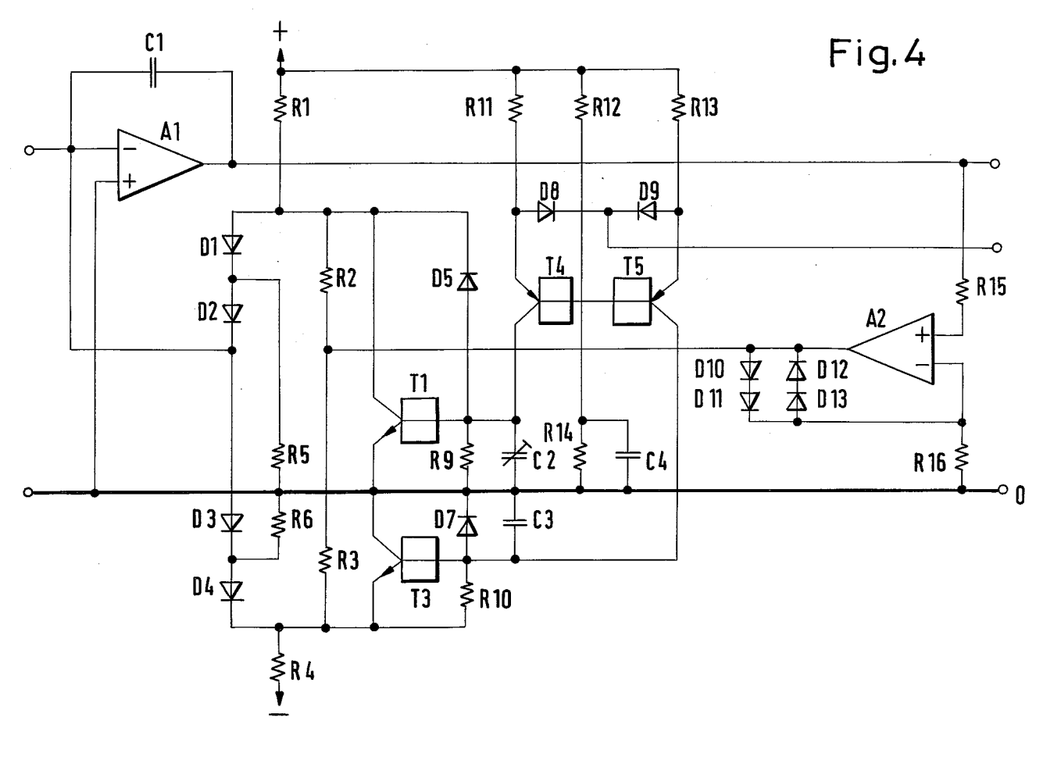

The pnp transistor T2 in FIG. 4 is replaced by the npn transistor T3 so as to control the discharge with a unipolar voltage or pulse source. Through the diodes D8, D9 the control signal is supplied to two controllable constant current sources, comprising the transistors T4, T5, the resistors R11, R12, R13, R14 and the capacitor C4 which drive the transistors T1, T3 with separate potentials. The auxiliary current for the diodes D1, D2, D3, D4 produced by the resistors R1, R4 in FIGS. 2, 3 and 4 can also be supplied by constant current sources.

Figure 5:
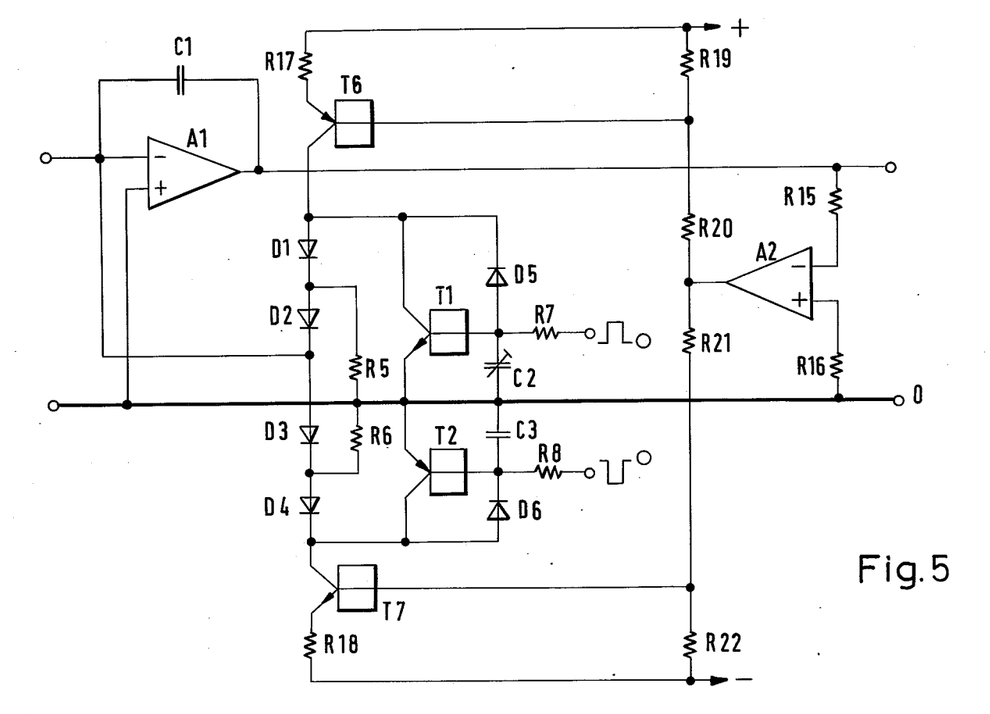

FIG. 5 shows an embodiment of the discharge circuit in which the auxiliary current for the diodes D1, D2, D3, and D4 is supplied by the constant current sources T6, R17 and T7, R18. The constant current sources are driven by the amplifier A2 through the resistors R20, R19 and R21, R22 so that the signal for transmission is superimposed on the auxiliary current as a result of which the balancing resistors R, R3 can be omitted. The polarities of the inputs of the amplifier A2 are interchanged because the constant current sources have an inverting action. This embodiment is particularly advantageous for large values of capacitance of the integrating capacitors C1. The discharge can of course also be controlled by the arrangement illustrated in FIG. 4.

The Equation (1) already drived from the output voltage of the integrator during the discharge state $$U_{aA1} = U_{e(-)A2} \frac{V_{A1} \cdot V_{A2}}{V_{A1} \cdot V_{A2} + 1}$$

states that the output voltage $U_{aA1}$ of the integrating amplifier A1 is practically equal to the input voltage $U_{e(-)A2}$ of the amplifier A2 if the amplification factors $V_{A1}$ or $V_{A2}$ are sufficiently large. The inverting input of the amplifier A2 in the embodiments illustrated in FIGS. 1 to 5 is connected to zero potential, i.e., $U_{e(-)A2} = 0\ V$, so that the output voltage $U_{aA1}$ of the integrating amplifier A1 is also 0 V. The said 0 V is retained when switching from the discharged state into the integrating state and no current for integration flows into the integrator input.

Figure 6:
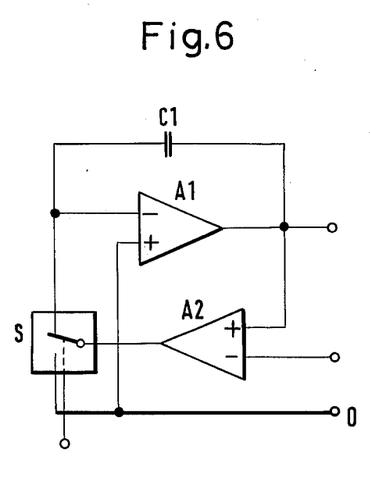
FIG. 6 is a basic circuit diagram of the discharge circuit according to the invention adapted as a scanning and holding circuit.

If instead of being connected to zero potential the inverting input of the amplifier A2 is connected with a voltage U during the discharged state so that $U_{e(-)A2} = U$, the output voltage $U_{aA1}$ of the integrating amplifier A1 will also be equal to the voltage U (FIG. 6). The said voltage U is retained on the output of the integrating amplifier A1 when switching from the discharged state into the integrating state and no current for integration flows into the integrator input. The voltage U at the inverting input of the amplifier A2 can also change in this state of integration without the output voltage $U_{aA1}$ of the integrating amplifier A1 being influenced thereby, since the connection between the output of the amplifier A2 and the inverting input of the integrating amplifier A1 is interrupted by the switching device S.

The voltage value which is applied to the inverting input of the amplifier A2 during the discharged state or at the time at which the discharged state is terminated is therefore stored during the integration state if no current for integration flows into the integrator input. It thereforefollows that the integratior together with the discharge circuit can be converted into a precise and exactly controllable scanning and holding circuit.

Figure 7:
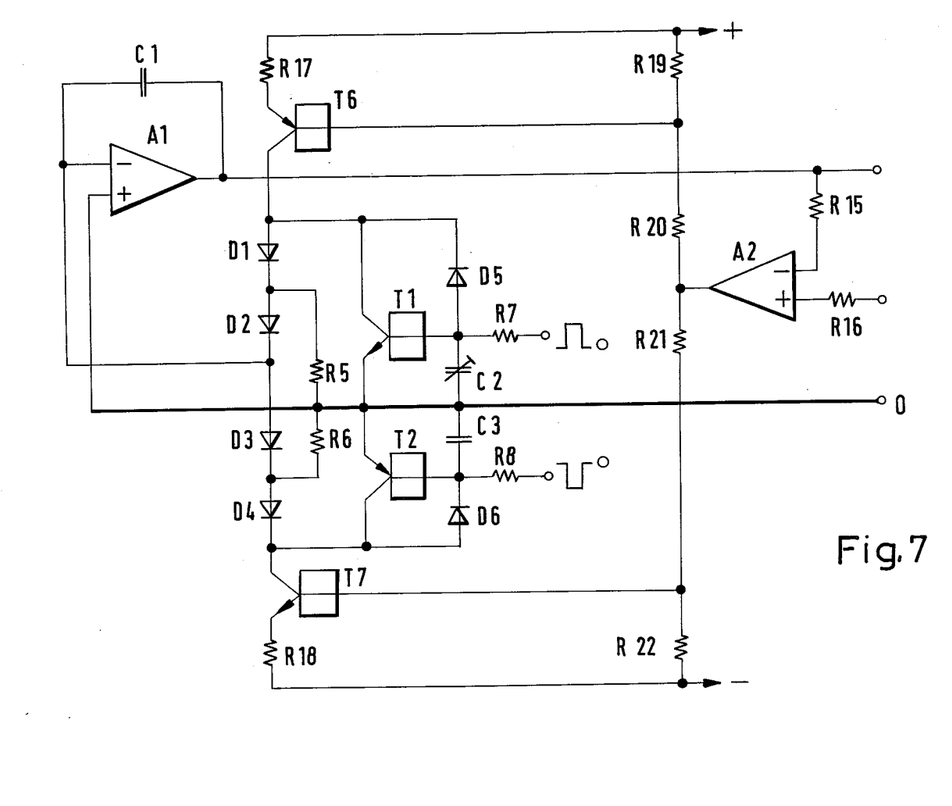
FIG. 7 is one embodiment of the scanning and holding circuit according to FIG. 6.

FIG. 7 shows a complete scanning and holding circuit. The polarities of the inputs of the amplifier A2 in this case are interchanged because the inverting constant current sources are connected downstream of the amplifier. The scanning and holding states can also be controlled by the arrangement illustrated in FIG. 4. Precisely controllable scanning and holding circuits are required for example for taking over and storing the value of the integral at the end of an integration intervals when signals which vary with respect to time are integrated in intervals so that the integration capacitor can be instantly discharged and is available for the next integration while at the same time the stored integral is converted into digital data, for example by means of an analog/digital converter, and the said data can then be processed by data processing means.

In combination with a data processing system the integrator described above with its discharge circuit and the scanning and holding circuit therefore represents an ideal combination for recording measured values of rapidly proceeding analog phenomena.

I claim:

1. In an integrating circuit including:
    an integrating amplifier having an inverting input for receiving a signal to be integrated, a non-inverting input and an output; and
    a feedback capacitor connected between the output and the inverting input of said integrating amplifier; the improvement comprising:
    (a) a second amplifier having an inverting input, a non-inverting input and an output;
    (b) means connecting the output of said integrating amplifier to one of said inverting and non-inverting inputs of said second amplifier; and
    (c) electrically controllable switching means connected to the output of said second amplifier; said switching means having a first condition in which the output of said second amplifier is connected to the inverting input of said integrating amplifier and a second condition in which the output of said second amplifier is connected to ground, said switching means comprising:
        (i) two semiconductor diodes connected in series; and
        (ii) means for actuating said diodes between a conductive state in which a dc connection is established between the output of said second amplifier and the inverting input of said integrating amplifier and a non-conductive state in which said dc connection is interrupted and a connection is established between the output of said second amplifier and ground.

2. A circuit as claimed in claim 1, wherein said means for actuating said diodes comprises means for passing an auxiliary current through said diodes to render said diodes conductive, and for diverting said auxiliary current to ground to render said diodes non-conductive.

3. A circuit as claimed in claim 2, wherein said means for actuating said diodes comprises a transistor pair connected in parallel with said diodes.

4. A circuit as claimed in claim 3, wherein said transistor pair comprises two complementary transistors, said means for actuating said diodes further comprising means for driving said complementary transistors with respective balanced voltages of different polarity.

5. A circuit as claimed in claim 3, wherein said transistor pair comprises two identical transistors, said means for actuating said diodes further comprising means for driving said two transistors with a unipolar voltage.

6. A circuit as claimed in claim 1, wherein said semiconductor diodes comprise first and second pico ampere diodes, said circuit further comprising a third diode having a short reverse delay and connected in series with said first diode at a first junction, and a fourth diode having a short reverse delay and connected in series with said second diode at a second junction.

7. A circuit as claimed in claim 6, comprising first and second high-value resistors connected between zero potential and said first and second junctions respectively.

8. A circuit as claimed in claim 2, further comprising constant-current source means to supply said auxiliary current.

9. A circuit as claimed in claim 8, wherein said connecting means connects said output of said integrating amplifier to said inverting input of said second amplifier, said output of said second amplifier being connected to drive said constant-current source means.

* * * * *